United States Patent [19]

Kapral

[11] Patent Number: 4,513,279
[45] Date of Patent: Apr. 23, 1985

[54] CHARGE REDISTRIBUTION MU-LAW PCM DECODER

[75] Inventor: Christopher W. Kapral, Belmont, Calif.

[73] Assignee: GTE Communications Products Corporation, Phoenix, Ariz.

[21] Appl. No.: 558,411

[22] Filed: Dec. 5, 1983

Related U.S. Application Data

[63] Continuation-in-part of Ser. No. 558,565, Dec. 5, 1983, Pat. No. 4,468,653, which is a continuation-in-part of Ser. No. 307,823, Oct. 2, 1981, abandoned.

[51] Int. Cl.³ ............................................ H03K 13/02
[52] U.S. Cl. .................... 340/347 DA; 340/347 AD; 340/347 C; 340/347 M; 370/7; 375/30
[58] Field of Search ............ 340/347 DA, 347 AID, 340/347 C, 347 M; 370/7; 375/26–30

[56] References Cited

U.S. PATENT DOCUMENTS 3,541,446 11/1970 Prozeller ................ 340/347 AD X

OTHER PUBLICATIONS

Haque et al., A Two-Chip PCM Voice Codec with Filters, IEEE Journal of Solid State Circuits, vol. SC-14, No. 6, pp. 961–969, 12/1979.
Caves et al., A PCM Voice Codec with On-Chip Filters, IEEE Journal of Solid State Circuits, vol. SC-14, No. 1, 2/1979, pp. 65–73.
Gray et al., A Segmented Mu-255 Law PCM Encoder, IEEE Journal of Solid State Circuits, vol. SC-11, No. 6, 12/1976, pp. 740–747.
Kaneko, A Unified Formulation of Segment Companding Laws, The Bell System Technical Journal, 9/1970, pp. 1555–1588.

*Primary Examiner*—T. J. Sloyan
*Attorney, Agent, or Firm*—Russell A. Cannon

[57] ABSTRACT

An integratable mu-law PCM decoder including only a single operational amplifier having a unit valued feedback capacitor C1, and second and third unit valued switched capacitors C2 and C3. Switch means cyclically connects C2 between ground and either ground or a reference voltage, and across C1 for providing an indication on C2 of the step offset in a prescribed segment; cyclically connects C3 between ground and the reference voltage and across C1 for stepping through segments below the prescribed segments; transfers all of the charge on C2 to C1 for the prescribed segment; and alternately connects opposite sides of C3 to ground and across C1 for segments above the prescribed segment for redistributing charge on the capacitors and producing an analog signal sample on C1. In an alternate embodiment for satisfying the A-law, all charge on C3 is transferred to C1 for only a first segment that is below the prescribed segment.

15 Claims, 4 Drawing Figures

CHARGE REDISTRIBUTION MU-LAW PCM DECODER

RELATED APPLICATION

This is a continuation-in-part of Ser. No. 558,565 filed Dec. 5, 1983, now U.S. Pat. No. 4,468,653 issued Aug. 28, 1984 which is a continuation-in-part of Ser. No. 307,823 filed Oct. 2, 1981, abandoned.

BACKGROUND OF INVENTION

This invention relates to method and apparatus for decoding PCM digital input words, and more particularly to an integrated PCM decoder which is substantially insensitive to parasitic and stray capacitance effects.

PCM encoders and/or decoders are described in the articles "A Two-Chip PCM Voice Codec With Filters" by Y. A. Hakque, et al., IEEE Journal of Solid State Circuits, Vol. SC-14, No. 6, pages 961–969, December 1979; "A PCM Voice Codec With On-Chip Filters" by J. T. Caves, et al., IEEE Journal of Solid State Circuits, Vol. SC-14, No. 1, pages 65–73, February 1979; "A Segmented Mu-255 Law PCM Encoder Utilizing NMOS Technology" by Paul R. Gray, et al., IEEE Journal of Solid State Circuits, Vol. SC-11, No. 6, pages 740–747, December 1976; and "A Unified Formulation of Segment Companding Laws and Synthesis of Codecs and Digital Compandors" by H. Kaneko, The Bell System Technical Journal (BSTJ), September 1970, pages 1555–1588, which are incorporated herein by reference. Mu-law decoders operating on 8-bit PCM code words have employed arrays of binary weighted capacitors, the total array capacitance typically being 255 times the capacitance of the smallest capacitance of the array. The capacitances of the two largest binary weighted capacitors of the array are therefore 128 and 64 times that of the smallest capacitor thereof. In integrated circuit structures it is desirable to minimize the surface area of a chip that is required for individual circuit elements. It is readily seen that the chip area dedicated for integrated capacitors in such an integrated decoder may be reduced by approximately 50% by deleting only one of the binary weighted capacitors. An integrated decoder requiring a capacitance of only 32 times that of the smallest capacitor of an array is disclosed in copending patent application (infra).

An object of this invention is the provision of an improved PCM decoder requiring only three equal valued capacitors.

SUMMARY OF INVENTION

In accordance with this invention, apparatus for converting PCM code words into associated analog signal samples, (each word including first, second and third code groups of one or more binary bits which define the polarity, prescribed segment, and step offset within the prescribed segment for an associated analog signal sample), comprises: first, second and third capacitor means each having one and other sides thereof and each having the same value of capacitance; first means for impressing a prescribed reference voltage and ground on first and second bus lines; and first switch means responsive to the second and third code groups (a) for cyclically connecting one and other sides of the second capacitor means to ground and to one of ground and the reference voltage, respectively, for discharging the second capacitor means and charging it with the reference voltage in accordance with the level of a bit in the third code group, and then connecting the one and other sides thereof to associated sides of the first capacitor means for redistributing charge thereon a number of times corresponding to the number of bits in the third code group; (b) for discharging the first capacitor means; (c) for storing charge on the second capacitor means while cyclically connecting one and other sides of the third capacitor means to ground and to the reference voltage for charging the third capacitor means, and then connecting opposite sides of the third capacitor means to associated sides of the first capacitor means for redistributing charge on them a first prescribed number of times (which may be zero) associated with the prescribed segment; (d) for connecting one and other sides of the second capacitor means to the one side of the first capacitor means and ground, respectively, for transferring all charge on the second capacitor means to the first capacitor means for the prescribed segment; and (e) for cyclically connecting opposite sides of the third capacitor means to ground for discharging it and then connecting them to associated sides of the first capacitor means for redistributing charge on them a number of times corresponding to segments that are above the prescribed segment.

DESCRIPTION OF PREFERRED EMBODIMENTS

In order to maintain an acceptable signal-to-noise ratio with a minimum number of bits in a code word representing a discrete analog signal amplitude, PCM systems use non-linear coding schemes in which the quantizing increment decreases as the analog signal level or amplitude decreases. Stated differently, of the total available number of quantized values representable with a given number of bits, a more than proportionate number of bits are allocated to the smaller signal amplitudes. The segmented mu-law is possibly the best known and most widely used coding scheme in the United States. In it, the amplitude range of sampled analog signals is divided into 16 segments, 8 segments for positive analog input signal voltages and 8 segments for negative analog input signals. Each segment normally contains 16 steps. In the lowest segments which are designated $L = \pm 0$ (that are adjacent the origin), each step is a normalized unit value. In each successive segment, the step size of offset doubles: i.e., two units per step in segment $L=1$ (the binary name of the segment, rather than the position thereof with respect to the origin), four units per step in segment $L=2$, etc., to 128 units per step in segment $L=7$ (the eighth segment from the origin). In order to reduce the quantizing noise for low level analog signals, the step size at the origin or between segments may be different from what it is in the adjacent lower segment. By way of example, the two steps adjacent to and symmetrical about the origin may be merged into a single step, with the origin at its midpoint. That is, the first steps in the segments L=±0 are one-half unit high. Alternatively, the edge step or height of the last step in a segment may be 50% or 100% larger than other steps in that segment when the edge parameter a is 0.5 and 1.0, respectively (see BSTJ article, infra, Table I, page 1566). When the edge step is the same height as other steps in the segment, then a=0.

The total number of normalized units that the magnitude of an analog signal sample is spaced from the origin is defined by $$(2^L)[(16s)-16] \tag{1}$$

where L is previously defined and s is the step offset within a designated segment containing the analog signal sample. Since there is a total of 256 steps, the PCM code word defining the analog signal sample may be an 8-bit word consisting of three code groups. The first code group is the MSB (b7) of the PCM word and designates the polarity of the associated analog signal. It is a binary one for positive signal voltages and a binary zero for negative signal voltages. The next three bits (b6b5b4) comprise a second code word which is a binary number indicating a particular or prescribed segment containing the amplitude of an associated analog input signal, with 000 (L=0) representing the segment closest to the origin and 111 (L=7) representing the farthest segment. The last four bits or LSB's (b3b2b1b0) comprise a third code group designating the step offset in the prescribed or designated segment for an analog input signal sample, with 0000 being the first step and 1111 designating the last step in a particular segment. This companding and compression law coding format may be modified for transmission. This does not seriously change the codec transfer characteristic. The decoding characteristic is complementary to that of the encoding law described here. The segmented A-law coding scheme is more widely used in Europe. It is similar to the mu-law coding scheme except that the steps in the first two segments are of the same height, the step height doubling in each segment thereafter.

Figure 1:
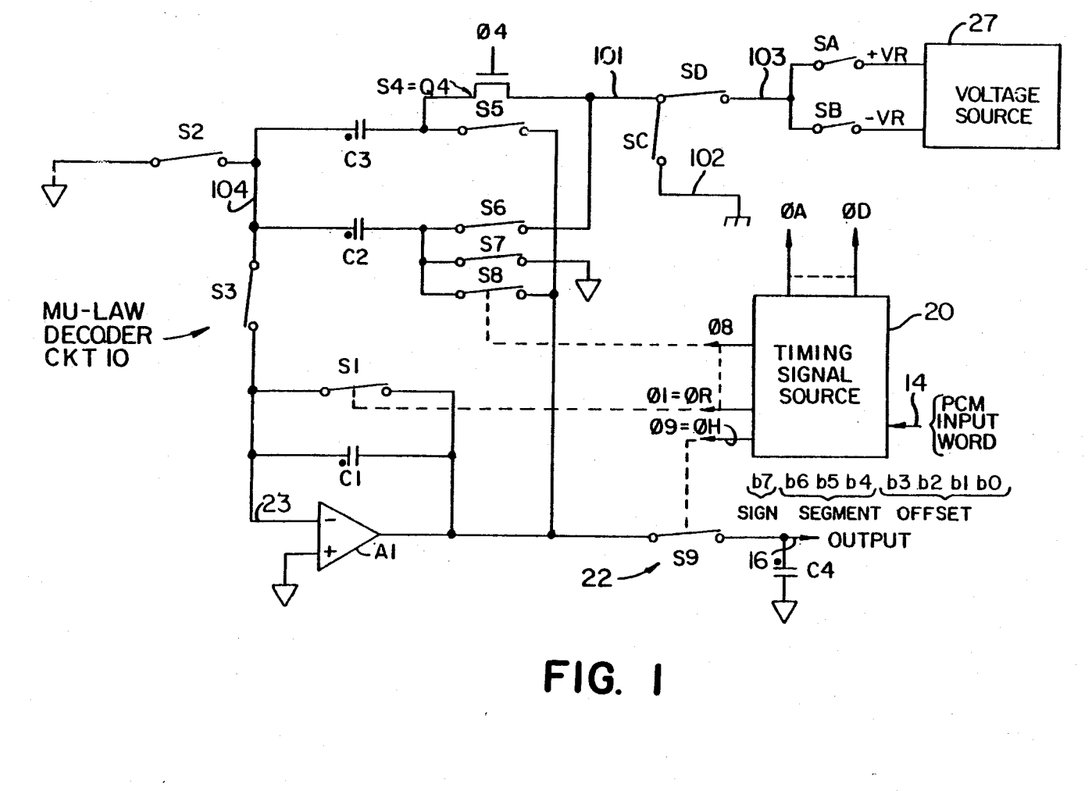
FIG. 1 is a schematic circuit diagram of a mu-law decoder 10 embodying this invention with switches generally shown in schematic form.

Referring now to FIG. 1, the mu-law PCM decoder 10 for converting an 8-bit PCM code word on line 14 to an associated analog signal sample on line 16 is preferably implemented in fully integrated circuit form. The PCM decoder 10 comprises a first integrated capacitor C1, second and third integrated capacitors C2 and C3 having the same values of capacitance as C1; pluralities of switches S1-S9 and SA-SD for selectively connecting and disconnecting the switched capacitors; a source 20 of timing control signals for driving the switches; and a sample-hold circuit 22 including an integrated capacitor C4 and a switch S9 which causes C4 to periodically sample and hold an analog output voltage Vo on A1. The dots adjacent one sides of the integrated capacitors designate the top plates thereof.

The amplifier A1 is preferably an integrated differential input operational amplifier associated with the feedback capacitor C1 so as to form a voltage controlled voltage source having a very low output impedance, a very high input impedance, a very high gain, and providing whatever output current is demanded by external circuitry. The top and bottom plates of C1 are connected to the inverting input and output terminals of A1. The non-inverting input of A1 is connected to ground for impressing a virtual ground potential on its input terminal 23. Thus, the top plate parasitic capacitance of C1 does not change the output impedance of A1 or the operation of the decoder since A1's output impedance is already substantially zero ohms. Also, the bottom plate parasitic capacitance of C1 does not affect the operation of the amplifier or the decoder since it is effectively connected to ground. This means that the decoder is generally insensitive to both top and bottom plate parasitic capacitance effects of C1.

The switches SA and SB are operative for continuously connecting line 103 to either a positive or negative reference voltage ±VR which is preferably provided by a voltage source 27. In contrast, the switches SC and SD are operative for selectively connecting line 101 to either ground or the reference voltage on line 103.

Figure 3:
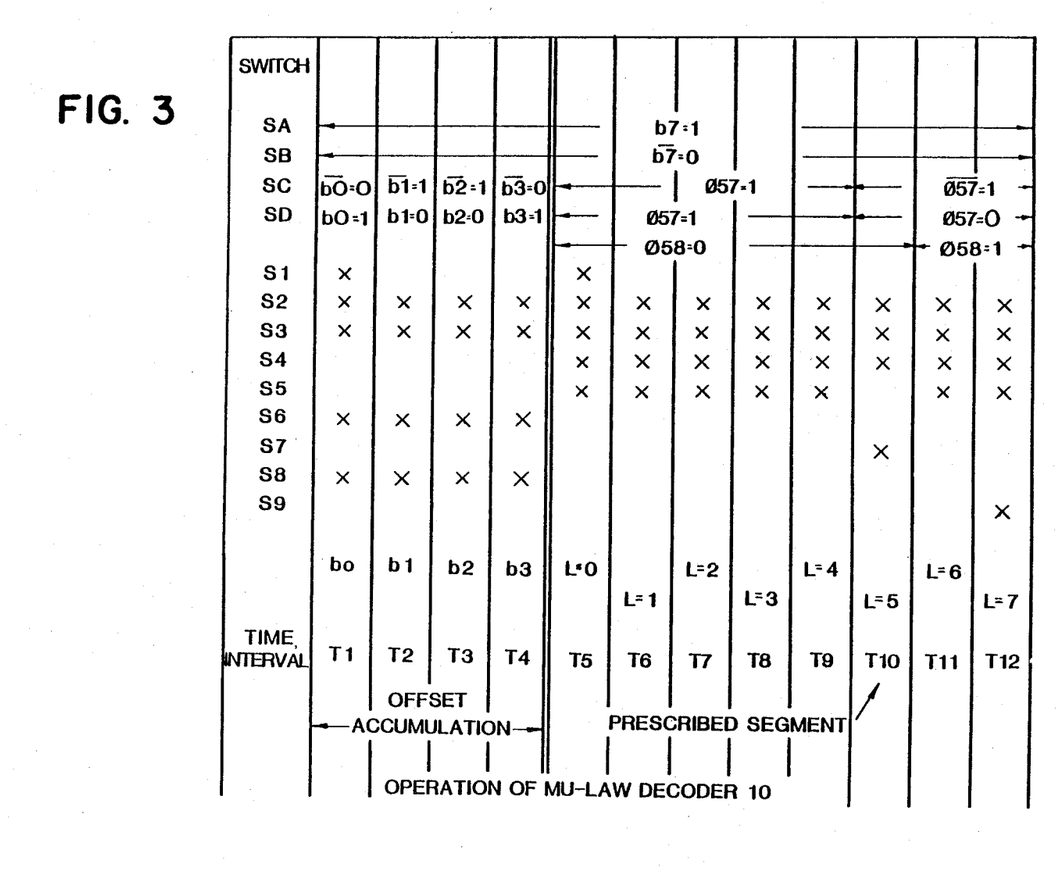
FIG. 3 is a timing diagram for switches S1–S9 of FIG. 1.

The switch S1 is periodically operative for discharging the feedback capacitor C1 prior to accumulating any charge on it for a current PCM input word on line 14 whereas S9 is operative for causing C4 to sample the voltage on C1 prior to operation of S1 for the next PCM code word. The switch S1 is also operative during a time interval T5 (see FIGS. 3 and 4), corresponding to operation for the first segment where L=0, for again resetting the charge on C1. The switches S2 and S3 operate for alternately connecting line 104 and the top plates of C2 and C3 to ground and the top plate of integrating capacitor C1 in adjacent time slots of each time interval. Conversely, the switches S5 and S8 operate for selectively connecting the bottom plates of C3 and C2 to the bottom plate of C1, whereas S7 is selectively operative for connecting the bottom plate of C2 to ground. Additionally, switches S4 and S6 are selectively operative for connecting the bottom plates of C3 and C2 to line 101 for either charging or discharging these capacitors. Thus, the switches are operative for selectively switching sides of C2 and C3 between ground and virtual ground; between ground and the output terminal of a voltage source; or between output terminals of voltage sources, as is described more fully hereinafter, so that the operation of the decoder is substantially insensitive to parasitic and stray capacitance effects associated with electrodes of the elements.

In an integrated circuit embodiment of the decoder 10 that is implemented in MOS technology, the switches comprise MOS FET transistors as is illustrated for the switch S4 in FIG. 1. Each of the switching transistors is driven by an associated digital timing or control signal from circuit 20 which is applied to its gate electrode. Alternatively, each switch may comprise a CMOS transfer gate for reducing feedthrough of the control signals and reducing the on-resistance of the switch. The switches operate over a total time period TP=12T for each PCM code word, with TP being divided into twelve time intervals T1, T2, ... T12 of equal duration (see FIG. 3). The particular sequence of operations of the switches in FIG. 1 is summarized in Table I and is explained more fully hereinafter.

The timing signal source 20 is operative for generating the timing signals ØA-ØD and Ø1-Ø9 in Table I on associated output lines. The source 20 may be similar to the corresponding circuit in FIG. 4 of the copending case Ser. No. 307,823, filed Oct. 2, 1981. It essentially comprises means for generating internal timing signals Ø57 and Ø58 for indicating whether the decoder is operating for a segment that is below or above the prescribed segment defined by bits b6b5b4 and internal timing signals T1, T2, ... T12 which define associated time intervals in FIGS. 3 and 4; non-overlapping timing signals ØS and ØT providing sample and dump (or toggle) pulses, in each timing interval (see FIG. 4); timing signal ØR having reset pulses 31 and 33 occurring in T1 and T5 prior to generation of the associated toggle pulses in ØT for resetting the charge on C1; and a timing signal ØH providing a timing pulse 37 at the end of each time period TP and occurring between the toggle pulse in ØT for the last time interval associated with one PCM word and the reset pulse in the first timing interval associated with the next PCM code word. The timing signal Ø57 is a binary 1 and 0 when operation for the current segment is below and above the prescribed segment, respectively. Conversely, Ø58 is a binary 1 and 0 when the current segment is above and below, respectively, the prescribed segment. Both $\overline{Ø57}$ and $\overline{Ø58}$ are a binary one when the decoder is operating for a current segment which is the prescribed segment. Logic expressions for the timing signals ØA-ØC and Ø1-Ø9, as a function of the aforementioned internally generated timing signals, are listed in Table I.

TABLE I
MU-LAW DECODER

ØA = b7

ØB = $\overline{b7}$

ØC = $(\overline{b_0} \cdot T1) + (\overline{b1} \cdot T2) + (\overline{b2} \cdot T3) + (\overline{b3} \cdot T4) +$ $\qquad (\overline{Ø57} \cdot (T5 + T6 + \ldots + T12))$ ØD = $(b_0 \cdot T1) + (b1 \cdot T2) + (b2 \cdot T3) + (b3 \cdot T4) +$ $\qquad (Ø57 \cdot (T5 + T6 + \ldots + T11))$

Ø1 = ØR

Ø2 = ØS

Ø3 = ØT

Ø4 = ØS·(T5+T6+ ... +T12)

Ø5 = ØT·(Ø57+Ø58)·(T6+ ... +T12)

Ø6 = ØS·(T1+T2+T3+T4)

Ø7 = (ØT·$\overline{Ø57}$·$\overline{Ø58}$)·(T5+T6+ ... +T12)

Ø8 = ØT·(T1+T2+T3+T4)

Ø9 = ØH

Figure 4:
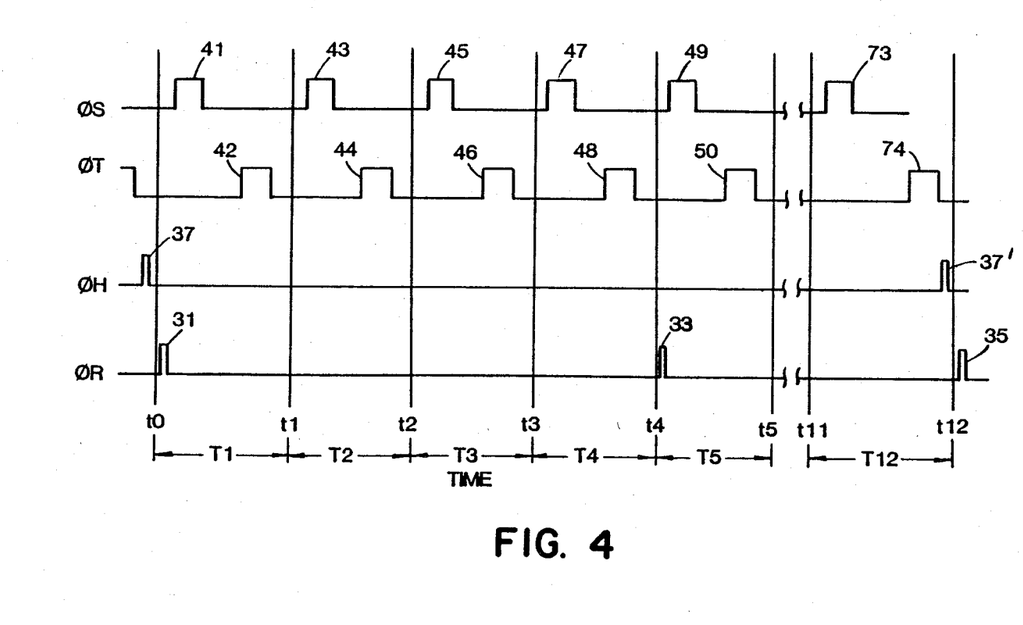
FIG. 4 is waveforms useful in explaining the operation of this invention.

The operation of the decoder 10 in FIG. 1 will now be considered for the PCM coded digital input word 11011001 on line 14 during the conversion cycle between times t0 and t12 in FIG. 4. This operation is outlined in FIG. 3 where an X in the first or second halves of a time interval indicates that the associated one of the switches S1-S9 is closed and the rows of binary symbols adjacent the switches SA-SD indicate which signals control the operation of the switches during associated time intervals. Considering only the input word, the MSB b7=1 indicates that the polarity of the associated analog signal is positive. This means that SB is open and SA is continuously closed for the current time period T1-T12 for impressing the positive reference voltage +VR on line 103. The third and second code groups 1001 and 101, respectively, here indicate that the amplitude of the analog signal corresponds to that of the ninth step in the sixth segment (which is the segment for L=5). This means that Ø57=1 for T5-T9 and Ø58=1 for T11-T12. In T10, $\overline{Ø57} = \overline{Ø58} = 1$ for the prescribed segment. Reference to the rows for switches SC and SD reveals that b0-b3 control the states thereof in associated time intervals T1-T4, whereas Ø57 and $\overline{Ø57}$ control the state of the switches in T5-T12.

Referring now to FIG. 1, the operation of SC and SD are controlled by b0,b1,b2 and b3 during T1-T4, respectively, for establishing a representation of the offset in the prescribed segment, prior to stepping through segments below and above the prescribed segment. Thus, during time interval T1 where the LSB b0=1, SC is open and SD is closed for applying the reference voltage to line 101. Also, the reset pulse 31 in ØR closes S1 prior to the ØS sample pulse 41 during T1 for momentarily short circuiting C1 and resetting the charge voltage on it to substantially 0. Switches S2 and S6 are then closed by the ØS sample pulse 41 for connecting C2 between ground and line 101 for charging it with the reference voltage. During the subsequent ØT toggle pulse 42, S3 and S8 are closed for connecting C2 across C1 for redistributing the charge on these equal valued capacitors. Since the next two bits b1 and b2 are both a binary 0 in T2 and T3, SD is open and SC is now closed for connecting line 101 to ground. This means that the ØS sample pulses 43 and 45 in T2 and T3 cause S2 and S6 to connect both sides of C2 to ground for discharging it during these time intervals T2 and T3. When the ØT toggle pulses in T2 and T3 close switches S3 and S8 for connecting C2 across C1, then C2 drains charge from C1 for effectively dividing the charge on C1 in half during each of these time intervals. And since the MSB b3 in the third code group is a binary 1, the pulses in ØS and ØT during T4 first cause S2 and S6 to again charge C2 with the reference voltage and then cause S3 and S8 to close for connecting C1 and C2 in parallel for again redistributing charge on them and establishing the final value of the step offset on C1 and C2 for the prescribed segment. This charge voltage on C2 is stored thereon until subsequent operation for the prescribed segment, i.e., in T10 here. Switch S1 is then responsive to the next ØR reset pulse 33 for discharging C1 prior to accumulating charge on it for successive segments during T5-T12.

As stated previously, since the prescribed segment corresponds to the time interval T10 in this example, Ø57=1 and Ø58=0 in T5-T9 (for segments below the prescribed segment) for closing SD and opening SC during these time intervals so as to connect the reference voltage to line 101. Conversely, since $\overline{Ø57}=1$ in T11-T12 (for segments above and including the prescribed segment), SC is closed and SD is now open during these time intervals for connecting line 101 to ground. Both of the timing signals $\overline{Ø57}$ and $\overline{Ø58}$ are a logic 0 in the prescribed segment. Thus, in T5-T9 the switches S2 and S4 are responsive to each of the ØS sample pulses for charging C3 with the reference voltage and the switches S3 and S5 are responsive to each of the associated ØT dump pulses in T5-T9 for connecting C3 in parallel with C1 for redistributing charge on them, i.e., for stepping through the segments L=0 to L=4. More precisely, the sample pulse 49 in T5 closes S2 and S4 for connecting C3 between ground and the reference voltage and charging it. The associated ØT toggle pulse 50 closes S3 and S5 for connecting C3 in parallel with C1 for redistributing charge on them. The switches S2 and S4 are again closed by the ØS sample pulse in T6 for starting a new sample-redistribution cycle. This operation of the converter during T5 impresses a charge on C1 that is associated with and corresponds to the amplitude of the first segment in the positive half of the mu-law characteristic. This operation is repeated during successive time intervals T6–T9 as the decoder cycles through the five time slots associated with the first five segments in the positive half of the mu-law characteristic which are below the prescribed segment. Consideration of this operation reveals that each time these switches cause C1 and C3 to complete a charge-redistribution cycle, the previous charge voltage on C1 is divided by 2, and then ½ of the charge voltage on C3 is added to it. Each time this charge-redistribution sequencing of C1 and C3 is repeated, the previous charge on C1 is divided by 2. The quantity of charge transferred during each sample-redistribution cycle represents sixteen steps of offset within a particular segment. In the example described so far, cycling or sequencing of the switches S2–S5 for accomplishing five charge-redistribution cycles accumulates charge for 5 times 16 steps on C1, where each set of steps is twice the size of steps of the preceding segment because of the successive division by 2. Thus, the output voltage on C1 is representable as $$Vo = \frac{\frac{VR/2 + VR}{2} + VR}{2} + \cdots$$

where the charge voltage on C1 is initially 0 volts.

In the time interval T10 corresponding to the prescribed segment, S3 and S7 are closed by the ØT dump pulse here for connecting the top plates of C2 and C1 together and the bottom plate of C2 to ground for transferring all of the stored charge on C2 (corresponding to the offset in the prescribed segment) to the integrating capacitor C1. During the next two time intervals T11 and T12, which correspond to segments that are above the prescribed segment, switches S2 and S4 are again closed by the ØS sample pulses for now connecting both sides of C3 to ground and discharging it, and switches S3 and S5 are closed by the associated ØT toggle pulses for redistributing charge on them and successively dividing down the charge voltage on C1 to a value corresponding to the offset in the prescribed segment. The result is that cycling of these switches S2–S5 during the last two time slots T11 and T12 reduces the charge on C1 by a factor of 4 for producing a charge voltage on C1 and in the output of A1 that is the magnitude of the analog signal sample for the designated PCM code word on line 14. Finally, S9 is responsive to the timing pulse 37' in ØH for closing so as to cause C4 to sample the analog output voltage on A1. This operation is defined by the tabulation in FIG. 3 and the timing signals in TABLE I.

Figure 2:
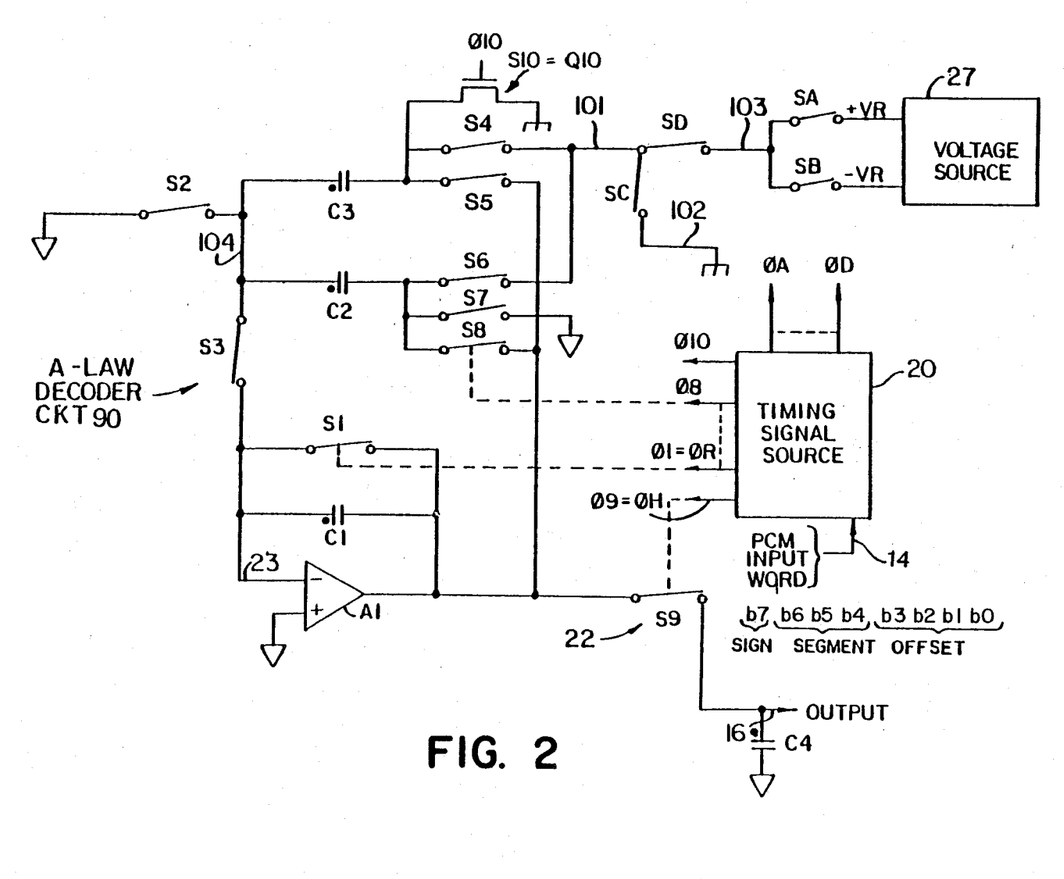
FIG. 2 is a schematic circuit diagram of an A-law decoder 90 embodying this invention.

A modified form of this invention for satisfying the A-law characteristic is shown in FIG. 2. The principal differences between the mu-law and A-law decoders in FIGS. 1 and 2 are that in FIG. 2: (1) the switch S4 is shown in schematic form; (2) a new switch S10, which is represented as an FET transistor Q10, is connected between the bottom plate of C3 and ground; (3) S5 is preferably no longer operative in the time interval T5 for the first segment; (4) S10 is preferably only closed in the time interval T5 for the first segment when the prescribed segment is other than the first segment; and (5) S5 is closed in T6 only when the prescribed segment is other than the first and second segments. The new timing signals for driving S5, S7 and S10 of the A-law decoder in FIG. 2 are listed in TABLE II.

TABLE II
A-LAW DECODER $Ø5(\text{A-law}) = \{ØT \cdot (Ø57 + Ø58) \cdot (T6 + \ldots + T12)\} \cdot \overline{\{(\overline{b6 \cdot b5 \cdot b4}) \cdot T6\}}$ $Ø7(\text{A-law}) = ØT \cdot \{(\overline{Ø57 \cdot Ø58}) \cdot (T6 + \ldots + T12)) + (T6 \cdot (\overline{b6 \cdot b5 \cdot b4}))\}$ $Ø10(\text{A-law}) = ØT \cdot T5 \cdot \overline{(b6 \cdot b5 \cdot b4)}$ Other timing signals are the same as listed in TABLE I. Considering the previous example where the prescribed segment is the sixth segment for L=5 in T10, the switches S3 and S10 are closed in T5 by the ØT toggle pulse for transferring all of the charge on C3 to C1 in only the first segment. Switches S3 and S5 are closed for other segments below the prescribed segment for connecting C3 in parallel with C1 during each ØT toggle pulse in as was described for the mu-law decoder 10. If the first segment is the prescribed segment, then no charge is transferred to C1 in T5 and S3 and S7 operate to transfer all of the charge on C2 to C1 in T6 and the desired operation is obtained for ensuring that the steps in the first and second segments are the same size. If the second segment is the prescribed segment, then S3 and S10 operate in T5 and S3 and S7 operate in T6 to transfer all of the charge on C3 and C2, respectively, to C1 in associated time intervals. This operation is required by the timing signals in TABLE II where the Ø57 and Ø58 in the first term in Ø5 cause S5 to close for segments, other than the first segment T5, that are below and above the prescribed segment; and the second term in Ø5 causes S5 to be open in T6 whenever the prescribed segment (b6b5b4) is the first segment. Consideration of Ø7 in TABLE II reveals that S7 is closed in the prescribed segment when it is in T6–T12 (first term of Ø7) and that it is also closed in T6 when the prescribed segment is the first segment. Finally, the timing signal Ø10 in TABLE II requires that S10 is closed only in T5, and that this only occurs when the prescribed segment is other than the first segment.

Although this invention is described in relation to preferred embodiments thereof, variations of modifications will occur to those skilled in the art without departing from the spirit and scope of this invention. By way of example, the ØH timing pulse for causing C4 to sample the output signal in T12 may occur any time after steady state is reached in the ØT pulse in T12 and prior to the subsequent ØR pulse in T1. Also, the ØR reset pulse in T1 may occur any time after the ØH pulse in T12 and prior to the subsequent ØT pulse in the adjacent T1. Additionally, the time intervals T1–T12 do not have to be of the same duration. Further, other timing signals may be employed to drive the switches. By way of example, Ø10 may be ØT·T5 which allows S5 to be closed for a ØT toggle pulse in T5 since ØC requires line 101 to be grounded at this time. The scope of this invention is therefore to be determined from the appended claims rather than from the aforementioned detailed descriptions of preferred embodiments.

I claim:

1. Apparatus for converting PCM code words into associated analog signal samples, each word including first, second and third code groups of one or more binary bits which define the polarity, prescribed segment, and step offset within the prescribed segment for an associated analog signal sample, said apparatus comprising:

first, second and third capacitor means each having one and other sides thereof and each having the same value of capacitance;

first means for impressing a prescribed reference voltage and ground on first and second bus lines, respectively;

operational amplifier means having input and output terminals thereof connected to said one and other sides of said first capacitor means, said input terminal essentially having ground impressed thereon; and first switch means responsive to the second and third code groups (a) for cyclically connecting one and other sides of said second capacitor means to ground and to one of ground and said reference voltage, respectively, for discharging said second capacitor means and charging it with the reference voltage in accordance with the level of a bit in said third code group, and then connecting one and other sides of said second capacitor means to associated sides of said first capacitor means for redistributing charge thereon a number of times corresponding to the number of bits in said third code group defining the step offset in the prescribed segment; (b) for discharging said first capacitor means; (c) for storing charge on said second capacitor means while cyclically connecting one and other sides of said third capacitor means to ground and to said reference voltage for charging said third capacitor means, and then connecting opposite sides of said third capacitor means to associated sides of said first capacitor means for redistributing charge on them a first prescribed number of times (which may be zero) associated with the prescribed segment which is designated by the second code group; (d) for connecting one and other sides of said second capacitor means to said one side of said first capacitor means and ground, respectively, for transferring all charge on said second capacitor means to said first capacitor means for the prescribed segment; and (e) for cyclically connecting opposite sides of said third capacitor means to ground for discharging it and then connecting them to associated sides of said first capacitor means for redistributing charge on them a number of times corresponding to segments that are above the prescribed segment which is specified by the second code group.

2. Apparatus according to claim 1 wherein said first switch means is operative during (a) above for bits of the third code group from the least significant to the most significant thereof.

3. Apparatus according to claim 2 wherein said first prescribed number of times that is associated with the prescribed segment designates the segment immediately preceding the prescribed segment.

4. Apparatus according to claim 3 further comprising sample-hold means periodically operative for sampling and holding the charge voltage on said first capacitor means that is obtained from a redistribution of charge on capacitor means for the last segment.

5. Apparatus according to claim 4 further comprising second switch means responsive to the first code group which designates the sign of the associated analog signal for controlling the sense of the analog output signal sample.

6. Apparatus according to claim 5 wherein said second switch means is responsive to the first code group for impressing one of a positive and negative reference voltage on said first bus line for prescribing the sign of the associated output analog signal sample.

7. Apparatus according to claim 5 wherein said second switch means is responsive to the first code group for performing one of the functions of inverting the signal sample and passing without inversion the signal sample held by said sample-hold means for fixing the sign of the associated analog signal sample.

8. Apparatus according to claim 5 including third switch means that is operative subsequent to operation of said sample-hold means for the last segment for resetting the charge voltage on said first capacitor means prior to accumulation of charge thereon for the next PCM code word.

9. Apparatus according to claim 8 wherein each of said capacitor means comprises an integrated capacitor and their one and other sides are the top and bottom plates thereof.

10. The method of decoding PCM code words for producing associated analog signal samples, each word including first, second, and third code groups of one or more bits which define the polarity, prescribed segment, and offset within the prescribed segment for an associated analog signal sample, comprising the steps of:

first connecting input and output terminals of an operational amplifier to one and other sides of a first capacitor means, the input terminal essentially having ground impressed on it;

resetting the charge on the first capacitor means;

second cyclically connecting one and other sides of a second capacitor means to ground and one of ground and a prescribed reference voltage, respectively, for discharging the second capacitor means or charging it with the reference voltage in accordance with the logic level of a bit in the third code group, and then connecting the one and other sides of the second capacitor means to associated sides of the first capacitor means for redistributing charge on the capacitor means a number of times corresponding to the number of bits in the third code group;

discharging the first capacitor means;

storing the charge on the second capacitor means;

third cyclically connecting one and other sides of a third capacitor means to ground and to the reference voltage for charging the third capacitor means, and then connecting opposite sides thereof to associated sides of the first capacitor means for redistributng charge on them a prescribed number of times (which may be zero) that is associated with the prescribed segment that is designated by the second code group;

fourth connecting one and other sides of the second capacitor means to the one side of the first capacitor means and ground, respectively, for transferring all charge on the second capacitor means (which corresponds to the step offset in the prescribed segment) to the first capacitor means;

fifth cyclically connecting opposite sides of the third capacitor means to ground, and then connecting them to associated sides of the first capacitor means for redistributing charge on them a number of times corresponding to segments that are above the prescribed segment which is specified by the second code group; and periodically coupling an analog signal sample from the first capacitor means;

the first, second and third capacitor means all having the same values of capacitance.

11. The method according to claim 10 wherein said second connecting step is performed for bits of the third code group from the least significant to the most significant thereof.

12. The method according to claim 11 wherein the prescribed number of times in said third connecting step designates the segment immediately preceding the prescribed segment.

13. The method according to claim 12 including the additional step of causing the analog signal sample coupled from the first capacitor means to have a polarity prescribed by the first code group.

14. The method according to claim 13 wherein said last named step comprises causing the prescribed reference voltage to be one of a positive and negative reference voltage as designated by the first code group.

15. The method according to claim 13 wherein the last named step comprises performing one of the steps of inverting the periodically coupled analog signal sample and passing a non-inverted coupled analog signal sample as designated by the first code group.

* * * * *